United States Patent [19]

Saari

[11] 4,342,003
[45] Jul. 27, 1982

[54] OPERATIONAL AMPLIFIER WITH INCREASED SETTLING SPEED

[75] Inventor: Veikko R. Saari, Spring Lake Heights, N.J.

[73] Assignee: Bell Telephone Laboratories, Incorporated, Murray Hill, N.J.

[21] Appl. No.: 131,238

[22] Filed: Mar. 17, 1980

[51] Int. Cl.³ .............................................. H03F 3/45
[52] U.S. Cl. ..................................... 330/253; 330/260
[58] Field of Search ....................... 330/253, 260, 294

[56] References Cited

U.S. PATENT DOCUMENTS 4,078,206  3/1978  Crowle ................................. 330/260
4,274,058  6/1981  Suzuki ................................. 330/253
4,284,957  8/1981  Haque ................................. 330/253

OTHER PUBLICATIONS

Jacobs et al., "Touch-Tone Decoder Chip Mates Analog Filtering with Digital Logic, Electronics", vol. 52, No. 4, Feb. 15, 1979, pp. 105–112.

Primary Examiner—Michael J. Tokar
Attorney, Agent, or Firm—Volker R. Ulbrich

[57] ABSTRACT

A compact, complementary metal-oxide on silicon integrated circuit operational amplifier (10, 70, 76) having a differential input stage and an output transistor (50) which has its bias current supplied by a complementary current source transistor (48) also includes filter means for coupling signals from the input stage to the gate (52) of the bias transistor (48). By these means, this normally relatively constant current is increased under certain signal conditions to increase the settling speed. In one form, the filter is a capacitor (64). In another form, it is a parallel combination of a capacitor (64) and a coupling transistor (72) in parallel. The capacitor (64) passes high frequencies, and the resistor (72) passes large amplitude signals. To prevent the signal coupling to the gate (52) from affecting other bias conditions in the circuit, the coupled portion of the gate is isolated from a bias control node (42) by a barrier device (66) which passes only D.C.

8 Claims, 4 Drawing Figures

019
OPERATIONAL AMPLIFIER WITH INCREASED SETTLING SPEED

TECHNICAL FIELD

The invention relates generally to operational amplifiers and relates more specifically to such amplifiers for incorporation into integrated circuits.

BACKGROUND OF THE INVENTION

Operational amplifiers for integrated circuits, such as for example the amplifier described by G. M. Jacobs et al. in "TOUCH-TONE Decoder Chip Mates Analog Filters with Digital Logic", *Electronics*, pp. 112, FIG. 7, Feb. 15, 1979, commonly occur in large numbers in a single integrated circuit. Therefore, it is important that their size be kept to a practical minimum, in order to keep the required chip area to a minimum. The necessity of maintaining a small size for the amplifiers often makes it particularly difficult to design into them certain desirable operating characteristics for a given circuit application.

One generally desirable operating characteristic of operational amplifiers used in integrated circuits for communication carrier applications is a high settling speed of the response for a step input signal. For small signals, this settling speed is a function of the bandwidth and the stability margins of the amplifier, which in turn are generally determined by fixed circuit parameters as demanded by the particular application of the circuit. For large signal steps, on the other hand, the settling speed is limited primarily by the slew rates of the amplifier. The slew rate, positive or negative, is the maximum rate at which the output voltage can change in the positive and negative direction, respectively, and for integrated-circuit operational amplifiers is commonly expressed in units of volts per microsecond. The expression "large signal" as used herein refers to a signal of at least such an amplitude that the linearity of the amplifier begins to be strained by the slew rate limitations. Thus, for an amplifier with given constraints of bandwidth and stability margins, an increased slew rate provides an avenue for improving the settling speed for large step input signals. While it would be possible to increase the slew rate by the direct method of increasing the size of the output transistors, such a step would require significantly more area for the amplifier and be likely to result in significantly increased size or power consumption.

SUMMARY OF THE INVENTION

The novel amplifier has a differential input stage connected to an output stage. The output stage includes a pair of complementary insulated-gate field-effect transistors with drain terminals having a common connection which is the output of the amplifier. A first one of the pair is the output transistor, and the second one is primarily the conventional bias current source for the output transistor. The gate of the output transistor is connected to a first output of the input stage to receive the voltage-amplified signal. The gate of the bias current source transistor is connected to a bias voltage node of a biasing network for the amplifier, not directly, but through a signal barrier device which blocks signals above a selected threshold, or corner frequency or above a threshold amplitude. The gate of the bias current source transistor is also connected to the signal from one or both outputs of the input stage through a filter, which may comprise an active and/or a passive filter component, or from a separate differential input stage. The passive filter component passes only signals exceeding the selected corner frequency value, and the active filter component passes only signals exceeding a certain threshold amplitude value. The bias current source transistor is thereby selectively activated as a signal-transmitting device for improving the stability margins and the slew rates, respectively, of the amplifier.

DETAILED DESCRIPTION

Figure 1:
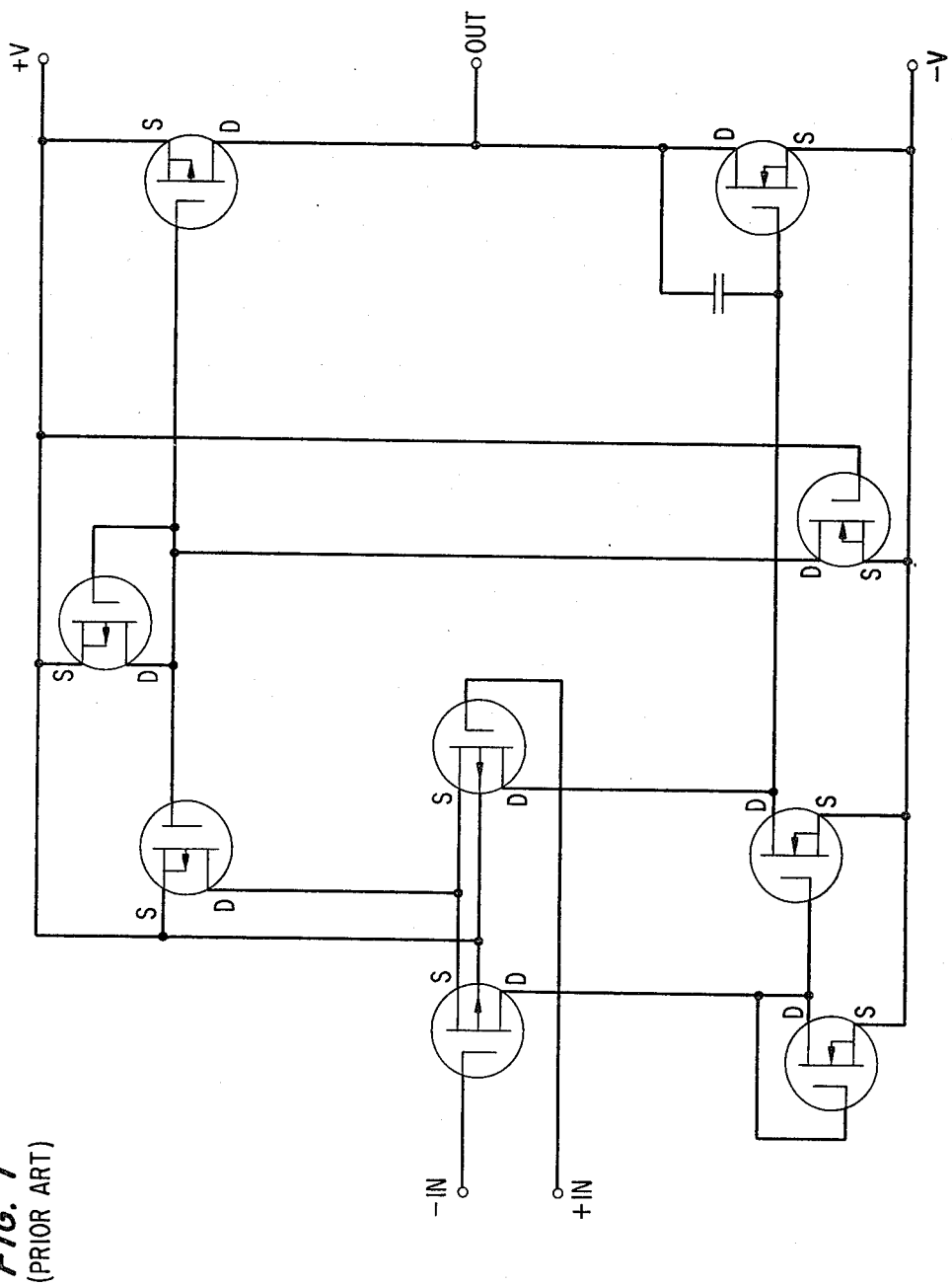
FIG. 1 is a schematic circuit diagram of a prior art operational amplifier such as that referred to above, but redrawn in a schematic diagram with different component orientation for convenience in comparison.

The prior art operational amplifier of the Jacobs et al. reference discussed above is shown in principle in FIG. 1. The physical orientation of the components are changed, however, to facilitate comparison to the amplifiers of the preferred embodiments which will be discussed below. It can be seen by inspection that the amplifier of FIG. 1 is electrically equivalent to that of Jacobs et al.

The circuits of the preferred embodiments described below are realized with complementary metal-oxide on silicon (CMOS) technology and depletion-type MOS devices. Conventional symbols for MOS devices are used, and, where appropriate and meaningful, each such device has associated with it the markings "S" and "D" as a convenience in determining which terminals are acting as the "Source" and "Drain" terminals, respectively.

The expression "common-source configuration", as used herein to describe the manner in which an MOS transistor is connected, means that the source terminal is connected to a fixed voltage and the gate and drain voltages vary with the signal voltage.

Figure 2:
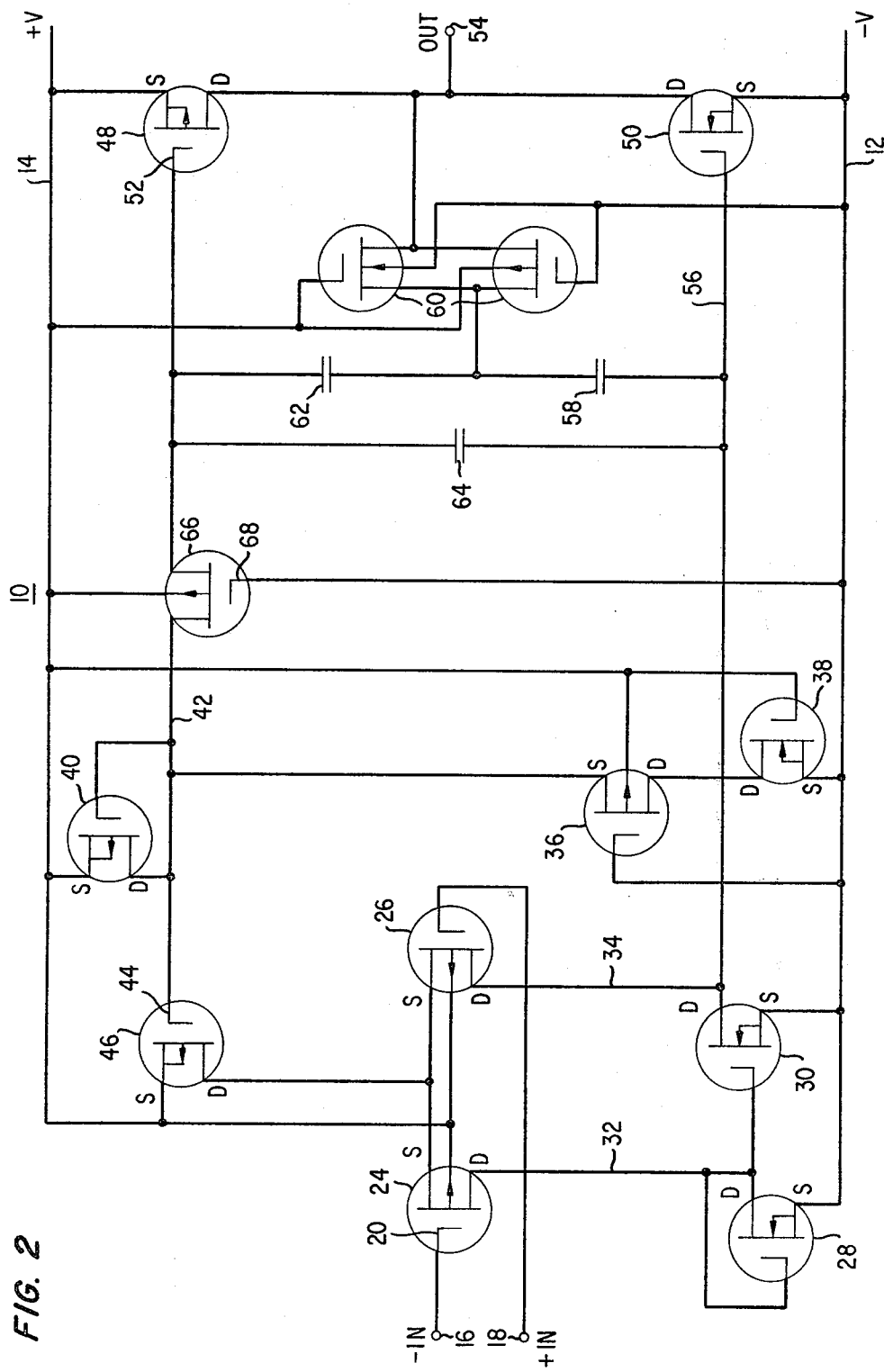
FIG. 2 is a schematic circuit diagram of an operational amplifier in accordance with one preferred embodiment of the present invention with increased stability margins for high frequency signals and moderately increased slew rates.

One preferred embodiment of an operational amplifier in accordance with the present invention is shown in the FIG. 2 of the drawings. The amplifier 10 includes a pair of power supply nodes 12, 14, an input stage with an associated current mirror transistor network, a bias network, and an output stage.

The input stage has a pair of input terminals 16, 18 tied to the gates 20, 22 of a pair of P-channel differential input transistors 24, 26. The outputs of the differential input transistors 24, 26 lead to an N-channel current mirror network with transistors 28, 30. This input stage has a low impedance output node 32 and a high impedance output node 34.

The bias network for the amplifier 10 includes two transistors 36, 38 which act together as a resistor to control the bias by means of a voltage regulator transistor 40. The transistor 40 determines the voltage of a bias control node 42 and thereby, by mirroring action, determines also the currents in other transistors. Connected to the bias control node 42 is the gate 44 of an input stage bias current source transistor 46, which is connected between the positive power supply node 14 and the input stage differential pair 24, 26.

The output stage includes a complementary MOS pair of transistors 48, 50. One transistor of this pair is a P-channel output bias current source transistor 48. The other is a N-channel output transistor 50.

The gate terminal 52 of the bias current transistor 48 is connected to the bias control node 42 of the bias network through transistor 66, which is an MOS resistor device acting as a resistor transparent to dc voltage when it has zero bias current. The output transistor 50 is connected in the common-source configuration, with its drain as the output terminal 54 of the amplifier 10. The control gate 56 of the output transistor is connected to receive the signal from the high impedance output node 34 of the input stage. A main shaping capacitor 58 in series with a linearized MOS resistor formed by two transistors 60 is connected in parallel across the output transistor 50 in a Miller capacitance loop configuration to provide the phase and gain margins to prevent oscillation. A further phase margin trimming capacitor 62 is connected from the gate 52 of the output bias current source 48 to a point between the main shaping capacitor 58 and the linearized MOS resistor transistors 60. A coupling capacitor 64 is connected between the high impedance output node 34 of the input stage and the gate 52 of the output bias current source 48. The bias voltage node 42 is isolated from the coupling capacitor 64 by a signal barrier transistor 66 which is transparent to the D.C. (Direct Current) bias voltage but substantially opaque to large or high frequency signals. The bulk terminal of this signal barrier P-channel transistor 66 is tied to the positive supply node 14, while its gate is tied to the negative supply node 12.

For small, low-frequency signals the amplifier 10 operates in a typical conventional mode well known to those of ordinary skill in the art. High frequency signals, however, are transmitted by the coupling capacitor 64 to the control gate 52 of the output bias current source 48, and thus drive both the output transistor 50 and the bias current source transistor 48. Therefore, as the voltage on the gate 56 of the output transistor 50 falls quickly toward that of the negative supply node 12 in the course of the upward slewing of the amplifier output 54, the voltage of the gate 52 of the output bias current source 48 is pulled down to speed up the slewing process. The signal barrier transistor 66 prevents the voltage of the bias control node 42 from being significantly effected by this action of the coupling capacitor 64.

Figure 3:
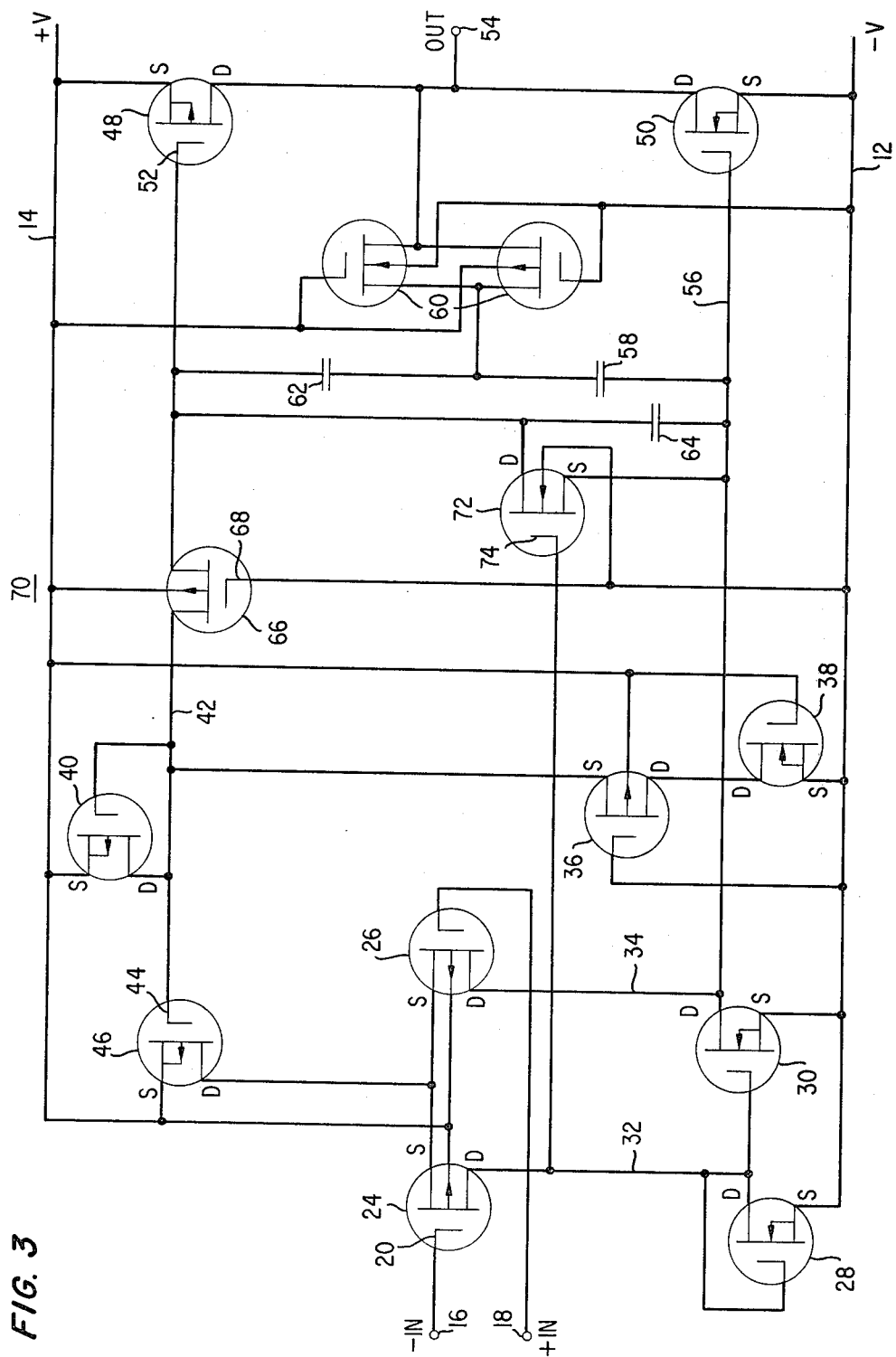
FIG. 3 is a schematic circuit diagram of an operational amplifier in accordance with another preferred embodiment of the invention, similar to the amplifier of FIG. 2, but having additional features for greater improvement of the positive slew rate.

FIG. 3 illustrates an amplifier 70 which is a modified version of the amplifier 10 of FIG. 2. The same reference numerals are used for the elements of the amplifier 70 of FIG. 3 as are used for the corresponding elements of the amplifier 10 of FIG. 2. The amplifier 70 of FIG. 3, however, includes in addition to these elements a large signal coupling N-channel transistor 72 connected between the output nodes 32, 34 of the input stage and the gate 52 of the output bias current source transistor 48. The gate 74 of the coupling transistor 72 is connected to the low impedance output node 32 of the input stage and the source is connected to the high impedance output node 34 of the input stage.

In the amplifier 70, a large signal results in a voltage step between the output nodes 32, 34 of the input stage which is large enough to overcome the threshold voltage of transistor 72. The transistor 72 is not conducting until this signal level is reached, but thereafter provides a large pull-down current for the gate 52 of transistor 48. This pull-down current is maintained as long as it takes the output terminal 54 to reach the vicinity of its correct voltage value. A large signal from the input stage causes the low impedance node 32 to rise, while the high impedance node 34 falls toward the voltage of the negative supply node 12 and the output 54 of the amplifier 70 is slewing upward. Under such conditions, transistor 72 pulls down the voltage of the gate 52 of the output bias current source 48, thereby increasing its current, and holds it down to speed up the slewing process.

Figure 4:
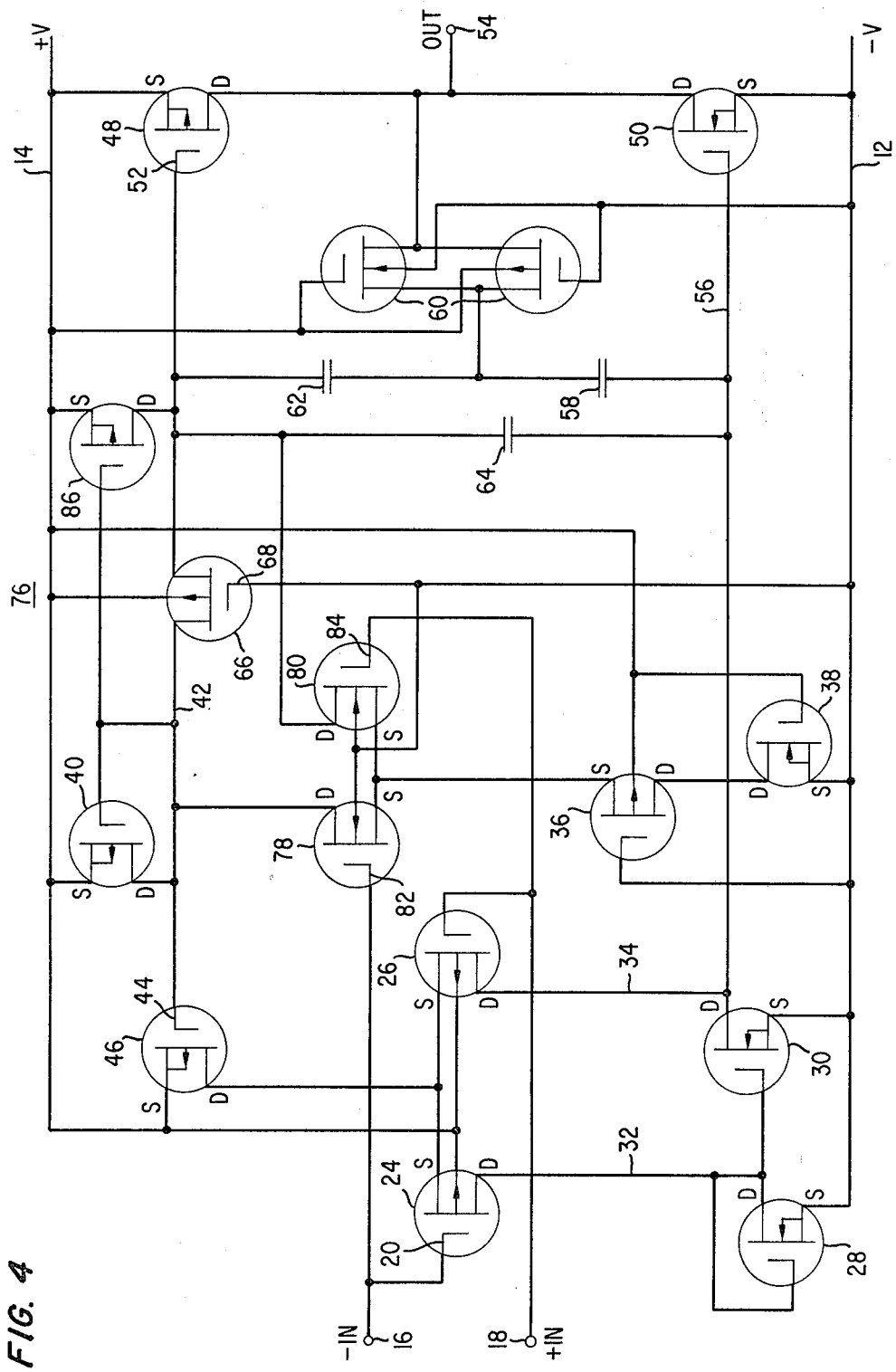
FIG. 4 is a schematic circuit diagram of an operational amplifier in accordance with a third preferred embodiment of the invention, similar in most respects to the amplifier of FIG. 3, and having a different large amplitude signal coupling network connected to the gate of the output bias current source transistor.

FIG. 4 illustrates an amplifier 76, which is a modified version of the amplifier 70 of FIG. 3. The same reference numerals are used for the elements of the amplifier 76 of FIG. 4 as are used for the corresponding elements of the amplifier 70 of FIG. 3. In amplifier 76 of FIG. 4, however, there is substituted for the coupling transistor 72 a separate signal input stage which includes a CMOS differential input pair of transistors 78, 80 with their respective control gates 82, 84 connected directly to the respective signal input terminals 16, 18 of the amplifier input stage. The bias current for the transistors 78, 80 is supplied by tying their sources to the bias network transistors 36, 38. The drain of the transistor 78 is connected to the bias voltage node 42, and that of the transistor 80 is connected to the gate 52. An additional bias current source transistor 86 is provided between the positive supply node 14 and the gate 52 in order to furnish the bias current which will thus be drawn from node of the gate 52 by transistor 80. The gate of the bias transistor 86 is appropriately connected to the bias control node 42. The small-signal gain of this bypass input stage is set low enough so that it does not substantially affect the overall small-signal characteristics of the amplifier. This setting of the gain may require an imbalancing of the differential input transistors 78, 80. The advantage of having such a separate large signal coupling network is that it makes possible a greater slew rate improvement than can be provided by the simpler arrangement of FIG. 3.

Those of ordinary skill in the art of CMOS circuit design recognize that a given CMOS circuit can alternatively be fabricated with all the polarities, including those of the channel conductivity type in the MOS devices, reversed. Such alternative forms of the circuits described above are considered to be within the scope of the invention.

While the amplifiers 10, 70, 76 described above are especially compact designs, there may be numerous alternative design configurations for various circuit portions of the amplifiers 10, 70, 76 above which can also be used with the inventive features described and claimed herein for practicing the invention. Such alternatives may be used, for example, for the input stage, its current mirror transistor network, and the bias network. The particularly significant features associated with the present invention pertain to coupling a source of an amplified signal to the control gate of the output bias current source transistor for the output transistor by means of a device which selectively transmits certain signals and does not transmit others. Such a device can more generally be termed a filter device. In the amplifier of 10 of FIG. 2, the filter device is the coupling capacitor 64, and the source of amplified signal is the high impedance output node 34 of the input stage. In the amplifier 70 of FIG. 3, the filter device is the combination of the coupling capacitor 64 and the coupling transistor 72. The source of amplified signal is now both of the output nodes 32, 34 of the input stage. In the amplifier 76 of FIG. 4, the filter device is the combination of the coupling capacitor 64 and the pair of input coupling transistors 78, 80 which act in combination to transmit large signals.

The barrier means for isolating the bias voltage node 42 from the effects of the amplified signal coupled to the gate 52 by the filter device need only pass very slow or D.C. variations in the bias voltage for the gate 52.

While the invention is described above in terms of circuits utilizing CMOS technology, it can also be practiced with other amplifying devices, such as other FETs (Field Effect Transistors) or bipolar transistors. The considerations involved in converting circuits between such different amplifying devices are well known to those of ordinary skill in circuit design.

The capacitance value of the phase margin trimming capacitor is preferably about an order of magnitude less than that of the main shaping capacitor 58. The particular dimensions and circuit parameter values for the other components of the amplifiers 10, 70, 76 must generally be determined for the particular application involved for the integrated circuit of which they are a part. Therefore, no specific values are given here.

I claim:

1. An operational amplifier (10) comprising positive and negative power supply nodes (14, 12); a differential input stage with first and second inputs (16, 18) and first and second output nodes (34, 32); an output stage comprising a first, output transistor (50) connected in a common-source configuration and having a first control electrode (56) connected to said first input stage node (34); and, bias means for elements of said input stage and output stage; said bias means comprising a control node (42) and a second, bias current source transistor (48) connected in series with said output transistor (50) between said power supply nodes (14, 12) and having a second control electrode (52), said amplifier being characterized by:

barrier means (66), connected at one side to said second control electrode (52) and at another side to said control node (42) of said bias means, for substantially preventing signals of at least a selected frequency or amplitude threshold value from passing to other elements of said bias means from said second control electrode (52), and filter means (64, 72, 78, 80) connected between a signal source and said second control electrode (52), said filter means (64, 72, 78, 80) being responsive to pass signals of at least said selected frequency or amplitude threshold value to result in additional current output through said bias current source transistor (48).

2. The amplifier according to claim 1 wherein said barrier means (66) is a first resistor device (66).

3. The amplifier according to claim 2 wherein said first resistor device (66) is a third field-effect-transistor having a third control electrode (68) connected to one of said power supply nodes (12).

4. The amplifier according to claim 3 wherein said filter means comprises a first capacitor (64) connected between said first and said second control electrodes (56, 52) for passing to said second control electrode (52) signals having at least a selected threshold frequency.

5. The amplifier according to claim 4 and comprising second and third capacitors (58, 62) connected in series between said first and second control electrodes (56, 52), the common connection of said second and third capacitors (58, 62) being connected through a second resistor device (60) to the shared connection of said first and second transistors (50, 48).

6. The amplifier according to claim 5 wherein said second capacitor (58) has a nominal capacitance value about ten times that of said third capacitor (62).

7. The amplifier according to claim 6 wherein said filter means comprises fourth (80) and fifth (78) transistors connected as a differential pair with their fourth (84) and fifth (82) control electrodes, respectively, connected to the first (18) and second (16) signal inputs of said first stage, said fourth transistor (80) being connected between said bias means and said second control electrode (52), said fourth (80) and fifth (78) transistors passing to said second control electrode (52) signals having at least a selected threshold amplitude.

8. The amplifier according to claim 6 wherein said filter means comprises a sixth transistor (72) for passing signals having at least a selected threshold amplitude, said sixth transistor being connected between said first (56) and second (52) control electrodes and having a sixth control electrode (74) connected to said second output node (32) of said input stage.

* * * * *